June 3, 1969 F. E. MUELLER 3,448,292
WIDEBAND AGC CIRCUIT
Filed Aug. 1, 1966

INVENTOR
FRANCIS EDWARD MUELLER

BY [signature]

ATTORNEY

United States Patent Office 3,448,292

Patented June 3, 1969

3,448,292

WIDEBAND AGC CIRCUIT

Francis Edward Mueller, San Jose, Calif., assignor to International Business Machines Corporation, Armonk, N.Y., a corporation of New York Filed Aug. 1, 1966, Ser. No. 569,284
Int. Cl. H03k 5/08
U.S. Cl. 307—237 10 Claims This invention relates generally to amplitude stabilizing circuits and particularly to automatic gain control systems for A.C. signals.

In the application of gain control circuits to A.C. signals, great care must be exercised if distortion of the signal is to be avoided. Nonlinearities in the gain control system may lead to a low frequency amplitude oscillation known as "motorboating" or to distortion in the form of improper gain control action.

Circuits incorporating one or more diodes, which have a controlled current flow therethrough, have commonly been employed as variable impedance elements to achieve gain control action. In conjunction with a transistor or tube type circuit, a pair of diodes may be coupled to bypass a degenerative impedance element. The effectiveness of the bypass and therefore also the gain, will depend on the impedance presented to the signal by the diode pair. Since the diode impedance for a given A.C. signal varies inversely as the diode current, the gain may be easily controlled.

While systems such as this may perform satisfactorily under certain conditions, they suffer from the inherent nonlinearity of diode devices. Where diodes are used to bypass a degenerative element the application of large signals, tending to reduce the diode impedance beyond the value established by the D.C. control current, will often induce wide uncontrolled amplitude excursions. These are caused by the fact that the diodes operate as low impedances to large signals to increase the gain at the very time it should be decreased.

Furthermore, the D.C. control current developed from the A.C. signal being stabilized requires a measure of filtering. This establishes a minimum time constant for control action. In some diode systems the control action is not symmetrical. While non-symmetrical control action may not always be a handicap, there are situations where it cannot be tolerated.

Heretofore the requirements of minimum distortion, stable operation and symmetrical control action have been satisfied only by complex and expensive circuitry.

It is, therefore, an object of my invention to provide an improved signal amplitude stabilizing circuit.

Another object of my invention is to provide an improved automatic gain control circuit.

Still another object of my invention is to provide an automatic gain control circuit having low distortion of the controlled signal.

A further object of my invention is to provide an automatic gain control circuit which does not exhibit instability.

A still further object of my invention is to provide an automatic gain control circuit which is symmetrical in its control action.

The invention utilizes a fixed impedance element in series with the controlled signal. The control or variable impedance circuit operates to increase or decrease the loss in the fixed impedance element by drawing more or less signal current through the fixed element. The variable impedance includes a transistor-diode combination in which the control voltage is applied to the base. The transistor-diode junction is capacitively coupled to the fixed impedance element. The current through the transistor-diode circuit determines the variable impedance.

Since large applied signals tend to decrease the diode impedances, the loss in the fixed impedance element is thereby increased to provide inherent stability. The use of a transistor-diode combination allows the use of a short time constant filter circuit which results in fast, symmetrical control action. Low distortion results from the controlled current through the transistor-diode combination.

The foregoing and other objects, features and advantages of the invention will be apparent from the following more particular description of a preferred embodiment of the invention, as illustrated in the accompanying drawings.

Figure 1:
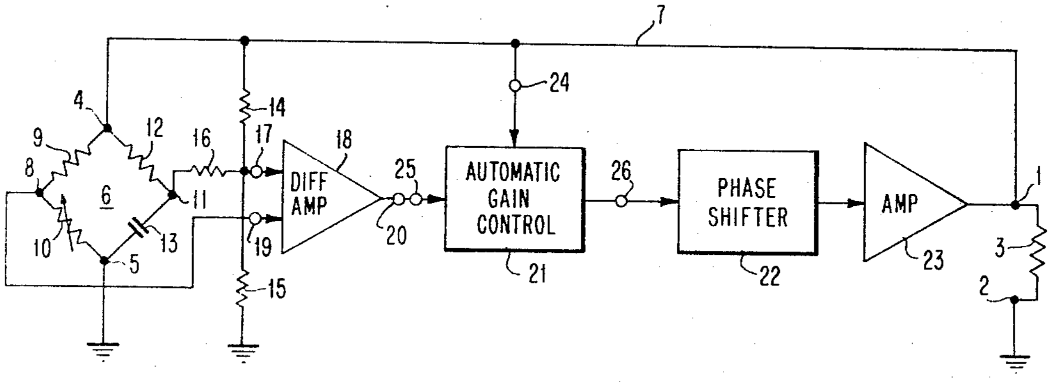
FIGURE 1 is a schematic drawing of an oscillator utilizing the automatic gain control circuit of the invention.

The phase shift oscillator shown in FIGURE 1 is of the type that is used to develop a signal having a frequency dependent on the value of an element in a self-excited bridge circuit. Such an oscillator is described in the IBM Technical Disclosure Bulletin, vol. 8, No. 3, pages 456–457.

The oscillator output terminals 1 and 2 are connected to a load 3. Output terminals 1 and 2 are also connected to the input terminals 4 and 5 of bridge 6 by means of feedback loop 7. Bridge output terminal 8 provides a variable amplitude signal which depends on the relative magnitudes of resistors 9 and 10. In the embodiment shown, resistor 10 is shown as variable. The value of resistor 10 may be made responsive to a condition such as temperature, pressure or other variable. The amplitude of the signal at bridge output terminal 8 is therefore a function of the value of the variable which operates on resistor 10. The signal at terminal 8 is in phase with the bridge excitation signal applied to bridge input terminals 4 and 5.

Bridge output terminal 11 provides an output signal which is phase shifted from the bridge excitation signal applied to terminals 4 and 5. Resistor 12 and capacitor 13 are selected to provide a 90° phase shift between points 8 and 11 at the nominal output frequency with resistor 9 equal to the value of resistor 10.

The voltage at the junction of resistors 14, 15 and 16 represents the vector sum of the phase shifted component and an in-phase component. Resistors 14 and 15 are in the same ratio as the nominal value of resistors 9 and 10. Since input 17 of differential amplifier 18 has an in-phase signal component which is equal to the in-phase component at input 19 at the nominal value of resistor 10, these in-phase components will cancel in differential amplifier 18. The signal at amplifier output terminal 20 will be 90° out of phase for this condition.

The operation of the automatic gain control 21 will be discussed in detail later, since an understanding of the general oscillator operation is a prerequisite to a description of this part of the circuit. Assuming that gain control 21 is bypassed, phase shifter circuit 22 provides another 90° lag at the nominal frequency. The input signal to amplifier 23 is therefore 180° out of phase with the output signal at terminals 1 and 2. The amplifier 23 provides another 180° phase shift to satisfy the conditions for continuous oscillation.

Assume now that the value of resistor 10 is changed as a result of a change in pressure or other condition which operates on this resistor. Because the ratio of resistor 9 to resistor 10 now differs from that of resistor 14 to resistor 15, the in-phase components at inputs 17 and 19 will no longer be equal. As a result, the output signal will be the vector sum of the 90° component and the uncancelled in-phase component. The phase angle of the output of differential amplifier 18 will therefore be more or less than 90° depending upon the direction of change of value of resistor 10.

The frequency of oscillation is thereby altered since the requirement for a 360° total shift must still be satisfied. Oscillation frequency is shifted to a new value which provides the necessary 180° phase shift from bridge 6 and phase shifter 22.

Turning now to the AGC circuit and the necessity for holding the bridge excitation amplitude constant, it can be seen that the phase angle of the output of differential amplifier 18 will depend upon the relative amplitudes of the signals applied to the inputs 17 and 19. While this variable phase shift largely determines the frequency of oscillation, any amplitude induced distortion may also cause a phase shift with a further shift in frequency. It might be possible to avoid such amplitude induced phase shifts by designing the circuits to accommodate the full dynamic range without nonlinearity or other distortion. Such a solution is not practical because even if such a design were possible, the cost would be prohibitive.

The obvious answer to this problem is an AGC circuit. However, the requirement that the AGC circuit introduce no phase shift into the system is not easily satisfied with conventional AGC circuits. It will be appreciated that a phase shift introduced by the AGC circuit and variable in accordance with the AGC signal would operate to destroy the relationship between the value of resistor 10 and the frequency of oscillation.

Furthermore, the AGC circuit must be free of instabilities or nonlinearities in the normal operating region since these two will operate to destroy the desired relationship between the value of resistor 10 and the oscillation frequency. While the AGC action is desirably linear in the range of normal operation, it is also desirable that some form of limiting be introduced when normal operating ranges are exceeded. This promotes rapid recovery of the system and minimizes the disturbance.

Figure 2:
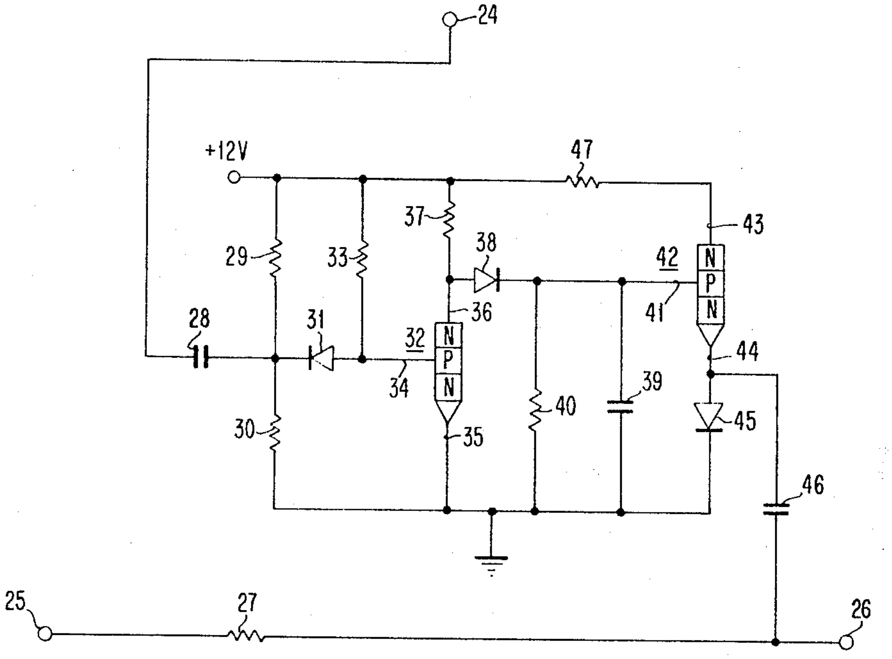
FIGURE 2 is a detailed schematic drawing of the automatic gain control circuit of the invention.

These requirements are satisfied by the AGC circuit of FIG. 2. A terminal 24 is connected to feedback loop 7 to sense the amplitude of the bridge excitation signal. An input terminal 25 is connected to output terminal 26 by means of an impedance means such as resistor 27. Since resistor 27 is in series with an intermediate path traversed by the signal to be controlled, AGC action may be achieved by connecting a controlled variable impedance, shunt circuit at the output side of resistor 27 to introduce a variable signal drop across this resistor.

Control of the shunt circuit is accomplished in response to the amplitude of the signal sensed at terminal 24. A capacitor 28 connects feedback loop 7 to a voltage divider, made up of resistors 29 and 30, which is used to establish a reference potential. If an adjustable reference is desired, one or the other of resistors 29 or 30 may be variable in nature.

Resistor 29 and resistor 30 form a voltage divider having a point which establishes a reference bias for the cathode of diode 31, which is then back biased. Transistor 32 is forward biased into a first state by the current flowing through resistor 33 into base 34. The value of resistor 33 is selected to provide sufficient base current whereby the current flow from the power source saturates transistor 32 to develop a very low voltage between emitter 35 and collector 36. The low voltage at collector 36 clamps the junction of load resistor 37 and diode 38 to essentially ground potential. As a result, no current is conducted by diode 38 into integrating capacitor 39. Since diode 38 is back biased, as will be shown, no current flows in the reverse direction either. To provide a discharge path for capacitor 39, a resistor 40 is connected in shunt circuit. The value of resistor 40 is selected to provide a discharge curve which is symmetrical to the charging curve, taking into account the impedance presented by the connection to base 41 of transistor 42.

Since the voltage on feedback loop 7 is A.C. in nature, there will be a portion of the cycle during which the instantaneous amplitude of the signal will be negative with respect to the reference potential established by resistors 29 and 30. During these periods diode 31 will be forward biased causing the current flow through resistor 33 to be diverted from base 34 of transistor 32. Transistor 32 is thereby switched to a second or cut-off state causing current to flow through load resistor 37 and diode 38 into capacitor 39. The duration of the period during which transistor 32 is cut off is determined by the length of time that diode 31 is forward biased. This in turn is dependent upon the reference voltage established by resistors 29 and 30 together with the amplitude of the A.C. signal on feedback loop 7. As the A.C. signal amplitude increases, the portion of the cycle during which the diode 31 is forward biased is increased. Accordingly, the width of the current pulses from load resistor 37 diverted into capacitor 39 is increased. Since capacitor 39 serves to integrate these pulses, a longer pulse increases the voltage present across the capacitor and presented to a control electrode such as base 41 of transistor 42.

The effect of increased voltage at base 41 is to increase the current flow in the series circuit from the output terminal at collector 43 to output terminal at emitter 44 of transistor 42 through diode 45. Resistor 47 limits current flow through transistor 42 to a safe value. Capacitor 46, which may have a substantially greater value of capacitance than capacitor 39, connects the output side of resistor 27 to the series circuit at a point intermediate transistor 42 and diode 45.

The signal loss in resistor 27 is a function of the shunt impedance presented by the circuit including capacitor 46. Since capacitor 46 is fixed in value and the impedance over the range of operation is very low, the signal loss is determined according to the impedance of the series circuit as seen by capacitor 46. The reactance of capacitor 46 should be much less than the minimum impedance of the diode-transistor to minimize phase shift. It is to be noted that transistor 42 and diode 45 are in series circuit for D.C. but the base-emitter diode of transistor 42 and diode 45 comprise a shunt circuit for A.C. Within the normal operating range, the impedance of the series circuit of transistor 42 and diode 45 is inversely proportional to the current flow. Therefore, an increased amplitude of the signal on feedback loop 7 generates wider current pulses from transistor 32 to raise the integrated voltage at base 41, thereby increasing the current flow through collector 43, emitter 44 and diode 45. The resulting lower impedance presented to capacitor 46 serves to increase the signal drop across resistor 27. This in turn decreases the input to phase shifter 22 and amplifier 23 (FIG. 1) to reduce the oscillator output signal across terminals 1 and 2 and, therefore, also the signal on feedback loop 7 which is the bridge excitation signal. In this manner the bridge excitation signal is restored to the proper value.

In the event that the signal voltage on feedback loop 7 becomes inordinately high, the signal voltage presented to the junction of transistor 42 and diode 45 will be correspondingly high. At this point the base-emitter junction of transistor 42 and diode 45 coact to operate as a clipper. During this mode of operation the current drawn from capacitor 39 serves as base current to transistor 42 to supply an amplified current through collector 43. Capacitor 39 also serves to bypass base 41 to ground, thereby providing a dual function.

Connection of capacitor 39 to the base of transistor 42 allows the use of a much smaller capacitor than would otherwise be the case since capacitor 39 does not supply current directly to capacitor 46. This means that a circuit time constant may be selected virtually without regard for the current which must be supplied from capacitor 39. The current requirements for the filter capacitor in prior art circuits are such that small capacitors, necessary for short time constant AGC action, cannot be used.

Typical values for the AGC circuit of FIGURE 2 are:

| | | |
|---|---|---|
| Nominal frequency | Hz | 1000 |
| Supply voltage | v | 12 |
| Resistor 27 | | 1K |
| Capacitor 28 | mf | 0.1 |
| Resistor 29 | | 20K |
| Resistor 30 | | 3.9K |
| Diode 31 | | IBM DO |
| Transistor 32 | | IBM 100 |
| Resistor 33 | | 100K |
| Resistor 37 | | 20K |
| Diode 38 | | IBM DO |
| Capacitor 39 | mf | 10 |
| Resistor 40 | | 10K |
| Transistor 42 | | IBM 100 |
| Diode 45 | | IBM DO |
| Capacitor 46 | mf | 33 |
| Resistor 47 | | 1K |

While the invention has ben particularly shown and described with reference to a preferred embodiment thereof, it will be understood by those skilled in the art that the foregoing and other changes in form and detail may be made therein without departing from the spirit and scope of the invention.

What is claimed is:

1. In a phase shift oscillator, means for stabilizing the amplitude of the feedback voltage, comprising:
  - means for sensing the amplitude of the feedback voltage and deriving current pulses having a width proportional to said amplitude;
  - means including first capacitor means, for integrating said current pulses to provide a control signal;
  - transistor means having a control electrode, connected to said first capacitor means, and output terminals;
  - means connecting a first of said output terminals to a power source;
  - diode means connected to a second of said output terminals;
  - said power source, said transistor and said diode having a polarity of connection to provide a current flow, between said output terminals and through said diode, proportional to the signal at said base;
  - impedance means in series with an intermediate path traversed by the signal to be stabilized; and
  - second capacitor means connecting said impedance means to a point intermediate said diode means and said transistor means, whereby the impedance presented to said capacitor by the transistor-diode combination varies as a function of the control signal to regulate the signal drop across said impedance means.

2. A device according to claim 1 wherein said means for sensing includes:
  - a voltage divider having a point thereon which establishes a reference potential;
  - third capacitor means connecting said point to said signal to be stabilized;
  - transistor means having a control electrode, output electrodes and load means connected to said output electrodes,
    - bias means connected to said control electrode to bias said transistor into a first state;
    - diode means connected to said control electrode and said point and polarized to conduct during the portion of a cycle when the instantaneous potential of said signal exceeds the reference potential, in the sense which allows conduction through said diode, to switch said transistor into a second state, and produce a current pulse at said load means.

3. A device according to claim 2 wherein said means for integrating includes:
  - diode means connected to conduct said current pulses into said first capacitor means and block the discharge of said first capacitor means,
  - resistance means in shunt circuit with said first capacitance means having a value proportioned to provide a symmetrical charge and discharge curve.

4. A device according to claim 1 wherein said means for integrating includes:
  - diode means connected to conduct said current pulses into said first capacitor means and block the discharge of said first capacitor means;
  - resistance means in shunt circuit with said first capacitance means having a value proportioned to provide a symmetrical charge and discharge curve.

5. A device according to claim 4 wherein said first capacitor means in said means for integrating has a substantially smaller value of capacitance than said second capacitor means.

6. In a shunt regulator for a phase shift feedback oscillator:
  - means connected to the feedback loop for deriving a pulse type signal having an energy content responsive to the amplitude of the feedback voltage;
  - means connected to said means for deriving said pulse type signal for integrating said signal;
  - a variable impedance circuit comprising a transistor and diode in series circuit;
  - means connecting said transistor to said integrating means to provide circuit impedance responsive to the integrated value of said pulse type signal; and
  - means connecting a point on said circuit intermediate said transistor and said diode to the circuit to be regulated.

7. A device according to claim 6 wherein said means for deriving a pulse type signal includes:
  - a voltage divider having a point thereon which establishes a reference potential;
  - capacitor means connecting said point to said feedback loop;
  - transistor means having a control electrode, output electrodes and a load connected to said output electrodes,
    - bias means connected to said control electrode to bias said transistor into a first state,
    - diode means connected to said control electrode and said point and polarized to conduct during the portion of a cycle when the instantaneous potential of said signal exceeds the reference potential, in the sense which allows conduction through said diode, to switch said transistor into a second state, and produce a current pulse at said load.

8. A device according to claim 6 wherein said means for integrating includes:
  - diode means connected to conduct said pulses into said capacitor means and block the discharge of said capacitor means;
  - resistance means, in shunt circuit with said capacitor means, having a value to provide a symmetrical charge and discharge curve.

9. A device according to claim 8 wherein said means connecting a point to the circuit to be regulated includes a capacitor having a value substantially greater than the capacitor means in said means for integrating.

10. In a feedback phase shift oscillator including:
  - a bridge circuit having a variable impedance and two output signals,
  - a first of said signals in-phase with the excitation to said bridge and having an amplitude variable as a function of the variable impedance;
  - a second of said signals being phase shifted with respect to the excitation to said bridge;
  - means for combining said second signal with a predetermined portion of said excitation to said bridge;

differential amplifier means having a first input energized by said first signal and a second input energized by said combined signal, the input signals to said differential amplifier being proportioned to provide an output signal 90° out of phase with respect to said input to said bridge for a given value of said first signal, and an output of greater or less than 90° phase shift in response to changes in amplitude of said first signal to values above and below the amplitude which gave a 90° phase shift;

the improvement comprising means for stabilizing the bridge excitation voltage including:

a voltage dvider having a point thereon which establishes a reference potential, circuit means connecting said point to said bridge for applying said bridge excitation voltage to said point, first transistor means having a control electrode, output electrodes and load means connected to said output electrode, bias means connected to said control electrode to bias said transistor into a first state;

diode means connected to said control electrode and said point and polarize to conduct during the portion of a cycle when the instantaneous potential of said signal exceeds the reference potential in the sense which allows conduction through said diode, to switch said transistor into a second state and produce a current pulse at said load means, means for integrating said current pulses comprising a first capacitor, diode means connected to said load and said first capacitor to conduct said current pulses into said first capacitor means and block the discharge of said first capacitor means;

resistance means in shunt circuit with said first capacitor and having a value proportioned to provide a symmetrical charge and discharge curve;

second transistor means having a control electrode connected to said first capacitor means, and output terminals;

means connecting a first of said second transistor output terminals to a power source;

diode means connected to a second of said second transistor output terminals;

said power source, said second transistor and said diode having a polarity of connection to provide a current flow, between said output terminals and through said diode, proportional to the signal at said base;

impedance means in series with an intermediate path traversed by the output signal from said differential amplifier;

a second capacitor connecting said impedance means to a point intermediate said diode means and said transistor means whereby;

the impedance presented to said capacitor by the second transistor-diode combination varies as a function of the control signal to regulate the signal drop across said impedance means.

References Cited

UNITED STATES PATENTS

| | | | |
|---|---|---|---|
| 2,451,858 | 10/1948 | Mork | 331—137 |
| 2,452,586 | 11/1948 | McCoy | 331—137 |
| 2,498,759 | 2/1950 | Korman | 331—137 |
| 2,850,650 | 9/1958 | Meacham | 307—237 |
| 3,289,102 | 11/1966 | Hayashi | 331—137 |

ARTHUR GAUSS, *Primary Examiner.*

H. A. DIXON, *Assistant Examiner.*

U.S. Cl. X.R.

331—137